United States Patent [19]

Kapralis et al.

[11] Patent Number: 4,532,110

[45] Date of Patent: Jul. 30, 1985

[54] PROTECTED TRIGGER TO CONTROLLABLY INITIATE CRYSTALLIZATION

[75] Inventors: Imants P. Kapralis, 443020 S. Punta Del Este Dr., Hacienda Heights; Harry Krukle, 7023 Bevis Ave., Van Nuys, both of Calif. 91405

[73] Assignees: Imants P. Kapralis; Harry Krukle; William W. Haefliger, all of Pasadena, Calif. ; part interest to each

[21] Appl. No.: 565,699

[22] Filed: Dec. 27, 1983

[51] Int. Cl.³ .............................................. B01D 9/02
[52] U.S. Cl. ..................................... 422/245; 126/263
[58] Field of Search ................. 422/245, 254; 252/70; 23/301; 165/46, 63, 64, DIG. 4; 44/3 R, 3 A; 428/596; 126/263

[56] References Cited

U.S. PATENT DOCUMENTS

| | | | |
|---|---|---|---|
| 811,750 | 2/1906 | Spieske | 252/70 |
| 1,502,744 | 7/1924 | Perrault | 126/263 |
| 1,656,366 | 1/1928 | Sterling et al. | 44/3 A |
| 1,679,432 | 8/1928 | Lyon | 44/3 B |
| 1,894,775 | 1/1933 | Levenson | 126/263 |
| 2,157,169 | 5/1939 | Foster | 126/263 |
| 2,220,777 | 11/1940 | Othmer | 126/263 |
| 2,827,438 | 3/1958 | Broadley et al. | 126/263 |
| 3,175,558 | 3/1965 | Caillouette et al. | 126/263 |
| 3,475,239 | 10/1969 | Fearon et al. | 44/3 R |
| 3,536,058 | 10/1970 | Hearst | 126/204 |
| 3,550,578 | 12/1970 | Feron et al. | 126/263 |
| 3,854,156 | 12/1974 | Williams | 126/204 |
| 3,951,127 | 4/1976 | Watson et al. | 126/263 |
| 4,077,390 | 3/1978 | Stanley et al. | 23/301 |
| 4,106,478 | 8/1978 | Higashijima | 126/263 |
| 4,379,448 | 4/1983 | Kapralis et al. | 422/245 |
| 4,460,546 | 7/1984 | Kapralis et al. | 422/245 |

Primary Examiner—Hiram H. Bernstein
Assistant Examiner—John Donofrio
Attorney, Agent, or Firm—William W. Haefliger

[57] ABSTRACT

A protected trigger usable in initiating crystallization of a supercooled salt solution comprises a thin metallic strip containing multiple openings. The strip is protected as by a peripheral frame and/or by a metallic coating.

15 Claims, 13 Drawing Figures

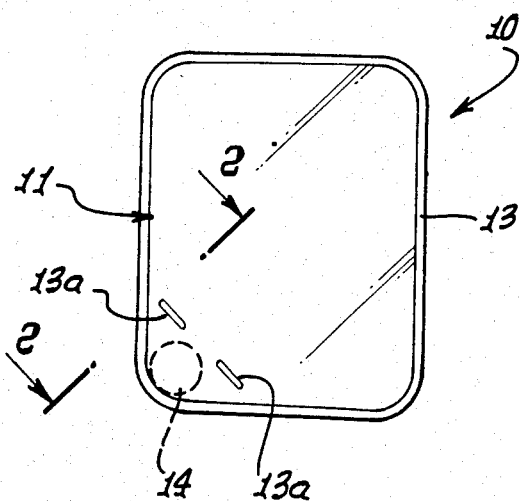
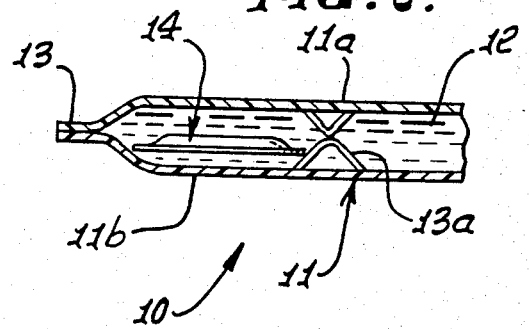
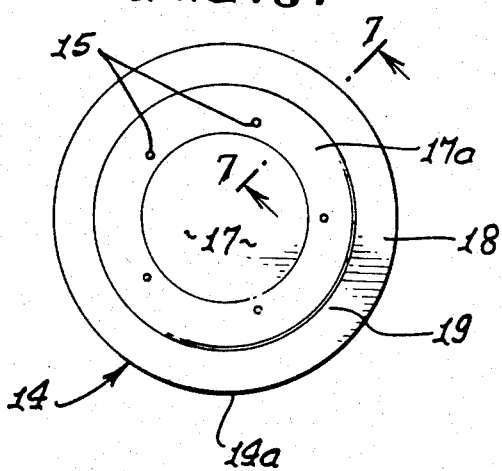
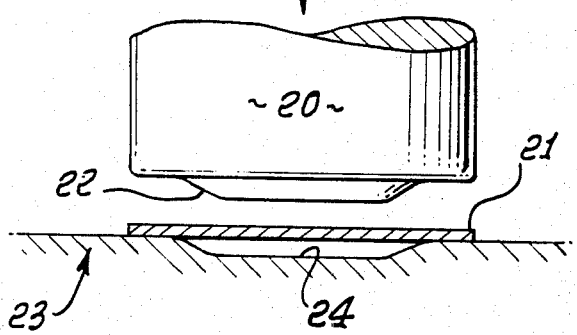
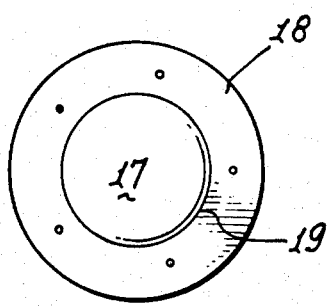
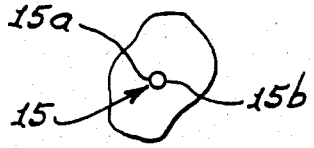
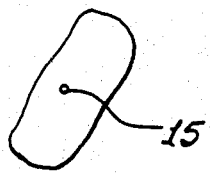

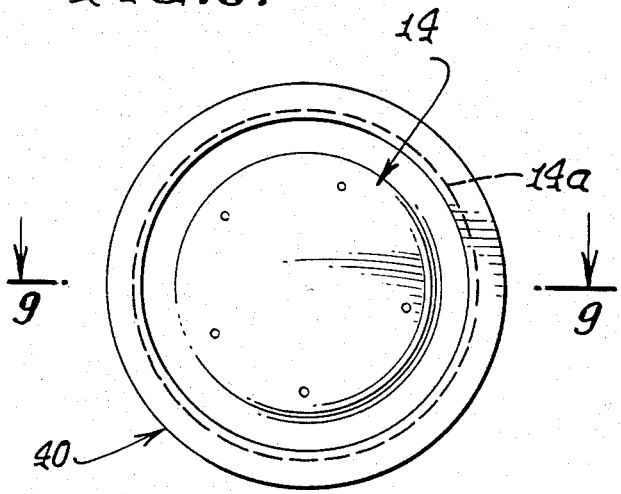
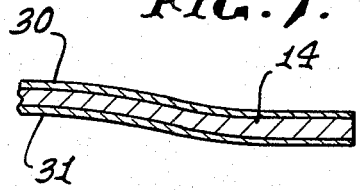
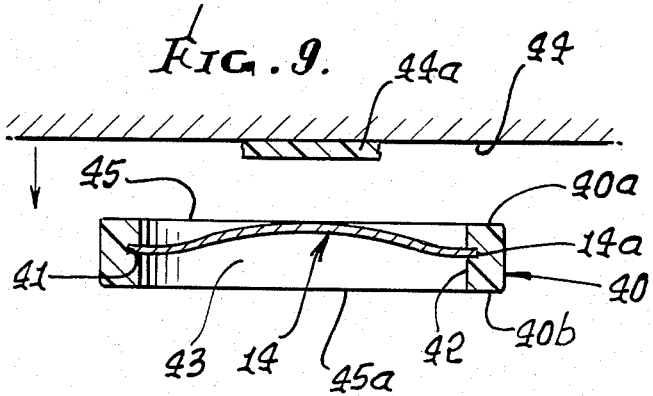
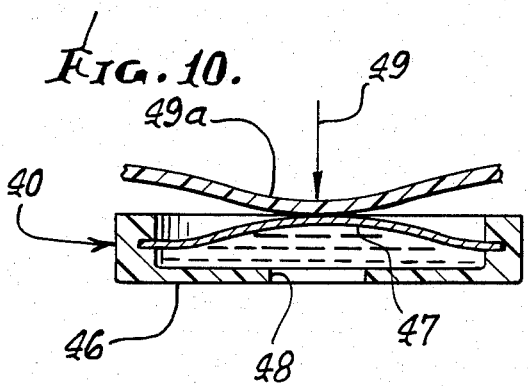
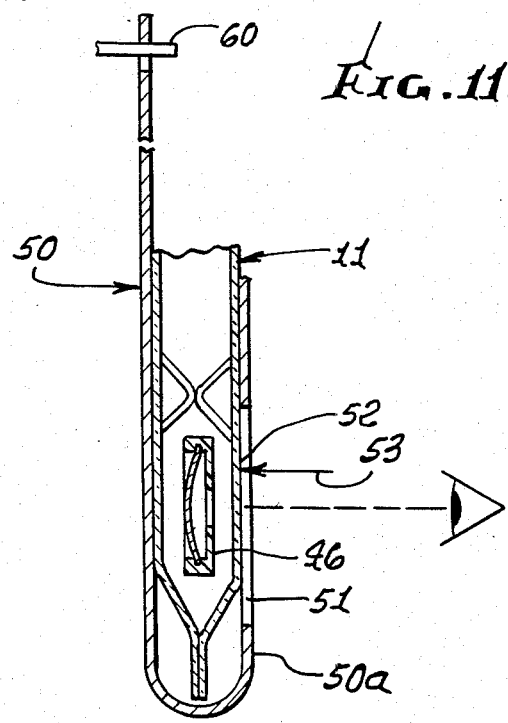

4,532,110

PROTECTED TRIGGER TO CONTROLLABLY INITIATE CRYSTALLIZATION

BACKGROUND OF THE INVENTION

This invention relates generally to the initiation of crystallization of a supercooled salt solution; more particularly, it concerns the provision of a protective trigger easily deformable and constructed to initiate such crystallization when the trigger is deformed, and without failure or injury to a plastic container in which the trigger is confined.

Devices of the general type with which the present invention is concerned are described in U.S. Pat. No. 4,077,390; however, such devices have tended to suffer from accidental triggering of crystallization. For example, accidental flexing of the actuator strips described in that patent can initiate unwanted crystallization. Also, the edges of such strips can and do tear the plastic container, causing leakage of the salt solution. This greatly aggravates the user and reduces the practicality and utility of such devices. Also, trigger surfaces can corrode or discolor.

SUMMARY OF THE INVENTION

It is a major object of the present invention to provide a protected trigger which will reliably and repeatedly produce or initiate crystallization of supercooled solutions; which is readily produced; and which will not injure or tear the plastic container in which it is incorporated.

Fundamentally, the trigger typically comprises:

(a) a thin, metallic strip having a perimeter, (b) said strip having a multiplicity of openings formed therein, each opening characterized as having opposed edges which face one another in near touching relation, (c) the strip further characterized as having configurations between which it is bendable for causing said edges to initiate progressive exothermic crystallization of said salt in the solution, (d) and a non-metallic frame extending about said perimeter and mounting said strip.

As will appear, the trigger may be formed as a disc wherein the openings are spaced inwardly from the boundary or periphery of the disc which is confined by the frame; the protective frame is preferably plastic and not corrodible or discolored in the solution; the disc typically has a dished central portion free of openings and adapted to "oil can" or snap "over center" when the disc is subjected to flexing or bending; the frame may include a wall opposite the concave side of the dished disc; and the disc or strip metal is typically impacted during fabrication to impact orient the molecular structure so as to aid the functioning of the disc or strip to produce or initiate crystallization. The strip typically consists of beryllium copper, and may be protectively coated with a noble metal such as gold plating.

These and other objects and advantages of the invention, as well as the details of an illustrative embodiment, will be more fully understood from the following description and drawings, in which:

DRAWING DESCRIPTION

FIG. 1 is a plan view of a device incorporating the invention;

FIG. 2 is an enlarged section taken on lines 2—2 of FIG. 1, and showing a trigger in one side elevation configuration;

FIG. 2a is a side elevation showing the FIG. 2 trigger in a second side elevation configuration, i.e. after snap-displacement;

FIG. 3 is a further enlarged plan view of the trigger seen in FIG. 2;

FIG. 4 is a side elevation showing a step in the fabrication of the FIGS. 2 and 3 trigger;

FIG. 5a is a fragmentary plan view of an opening as initially formed in the trigger blank or strip;

FIG. 5b is a fragmentary plan view like FIG. 5a, but showing the opening after impacting as in FIG. 4;

FIG. 6 is a view like FIG. 3, showing a modified trigger,

FIG. 7 is a section on lines 7—7 of FIG. 3;

FIG. 8 is a view like FIG. 3 showing a frame mounting the trigger;

FIG. 9 is a section on lines 9—9 of FIG. 8;

FIG. 10 is a section like FIG. 9, but showing a modification; and

FIG. 11 is an elevation showing an assembly, in section.

DETAILED DESCRIPTION

Referring first to FIGS. 1 and 2, a flexible heat pack 10 includes a flexible plastic container 11 containing a supercooled solution 12, one example being aqueous sodium acetate as referred to in U.S. Pat. No. 4,077,390. The container may consist of translucent or transparent plastic, such as PVC, polyurethane and polyethylene coated polypropylene. The upper and lower container walls 11a and 11b may be peripherally bonded or heat sealed together as indicated at 13, whereby the solution 12 is contained against leakage.

Located in the container is a trigger 14 adapted to be deformed to initiate exothermic crystallization of the salt in the solution, and for that purpose the concentration of the salt is sufficient to produce such crystallization in response to trigger bending, as will be described. The trigger may be retained in the container by interruptedly bonded portions of the container walls, indicated at 13a, inwardly of peripheral bonding 13; at the same time, the solution has access to the trigger, at all times, via interruptions between bonded portions 13a. Other trigger locations are usable; or, the trigger may freely float.

Generally speaking, the trigger comprises a thin strip, (for example about 0.005 inches thick) such as a non-ferrous metallic disc, having a perimeter indicated at 14a in FIG. 3. Workable non-ferrous metals have been found to include beryllium copper. Beryllium copper is a copper alloy containing a small amount of beryllium and typically some nickel or cobalt. The strip has a multiplicity of very small openings 15 formed therein, inwardly of perimeter 14a. Each opening or puncture is characterized as having opposed edges which face one another in near touching relation. Typically, the openings initially formed in the strip may be of pin-hole size. FIG. 5a shows a typical opening 15 as initially formed through the disc or strip, and with opposite elongated edges 15a. FIG. 5b shows an opening as it finally is formed or exists, with the edges 15a so close together that they do not appear distinct; however, there are slight gaps between and spaced along such edges, which may touch one another between the gaps. Other forms of openings are slits having near touching opposite edges.

The disc shaped strip 14 is characterized as having two configurations between which it is bendable with snap-displacement causing the described edges to initiate progressive exothermic crystallization of the salt in the supercooled solution in the container. Note for example the first stable configuration of the trigger strip 14 in FIG. 2, and its second (and relatively stable) curved configuration 14' in FIG. 2a. The user simply applies finger pressure on the container walls 11a and 11b snap-deforms the disc 14 to FIG. 2a configuration, in the container. This causes the edges 15a of the openings to actuate the crystallation, due to sudden deformation (as for example sudden local compression) of the solution trapped or confined in the spaces between the approximately touching edges. The snap-displacement of the nearly touching edges is found to initiate crystallation without failure or malfunction.

These purposes are served to unusual advantage by causing the disc to have dished configuration as in FIG. 2, so as to "oil can" when deformed, i.e. easily snap over-center into FIG. 2a configuration. Further, the disc has a central portion 17 free of openings, and an outermost annular section 17a. The latter contains the openings, which are typically spaced inwardly from the perimeter 14a so that the latter is continuous, aiding the snap-displacement referred to. In FIGS. 2, 2a and 3, the openings are located in the outermost annular section 17a of the dished portion of the disc; whereas in FIG. 6, the openings are located in the undished outer annular portion 18. Circles 19 in FIGS. 3 and 6 generally designate the boundary between the dished and undished portions.

The performance of the disc shaped strip to initiate crystallization is aided by impact orientation of the molecular structure of the edges 15a. FIG. 4 shows a striker 20 being forcibly urged downwardly toward blank 21, after the latter has had tiny openings 15 formed therein as described. The bottom of the striker is protuberant at 22 to "dish" the blank (i.e. permanently deform it to have a central bulge as in FIG. 2); thereafter, the trigger disc is stamped or cut out of the blank by a suitable die. Back up platen 23 in FIG. 4 has a recess 24 to receive the deformed bulge of the blank 21.

The disc or strip is typically protectively coated with a noble metal, such as gold, so as not to corrode or tarnish. See the coatings 30 and 31 on opposite surface of the disc 14, in FIG. 7. The coating for example has thickness less than 0.0001 inch, and may be electroplated on the strip or disc. Gold alloy (silver) may also be used.

FIGS. 8 and 9 show the provision of a plastic (as for example DELRIN) frame 40 about the perimeter 14a of the disc 14, to protect the disc. The ring-shaped frame confines the perimeter 14a as in an annular groove 41 in the inner wall 42 of the frame. The disc is sufficiently, or substantially completely confined within a zone 43 bounded by the frame, so that accidental triggering as by a moving surface 44 acting on plastic container wall 44a is prevented. Zone 43 is located between planes 45 and 46 defined by frame annular surfaces 40a and 40b that face axially oppositely. Note also that the plastic frame prevents gouging or tearing of the plastic container by the peripheral edge of the metallic strip or disc. The edge may have shape other than circular, and the looping frame follows the shape of the strip edge.

In FIG. 10, the frame 40 has a wall 46 opposite concave side 47 of the dished disc or strip, i.e. the strip bulges away from the wall 46. A central opening 48 in wall 46 allows fluid passage therethrough when the disc is depressed as indicated by arrow 49, and via plastic container wall 49a. The disc is snap displaced relative to the frame 40.

FIG. 11 shows a support package 50 for the container 11 which carries the trigger disc and frame. The package may be locally opened, as at 51 in package wall 50a, for viewing the transparent container 11, and trigger frame wall 46.

A customer who might press the container at 52, as indicated by arrow 53, cannot activate the trigger, since resultant pressing of trigger frame wall 46 does not produce such activation. To activate the trigger, the container 11 must be removed from the package. The latter for example consists of cardboard and hangs via hook 60 of a display rack.

We claim:

1. For use in initiating crystallization of a supercooled salt solution, a trigger comprising
    (a) a thin, metallic strip having a perimeter,
    (b) said strip having a multiplicity of openings formed therein, each opening characterized as having opposed edges which face one another in near touching relation,
    (c) the strip further characterized as having configurations between which it is bendable for causing said edges to initiate progressive exothermic crystallization of said salt in the solution,
    (d) and a non-metallic, cup-shaped frame extending about said perimeter and receiving and mounting said strip, the frame defining openings at opposite sides of the strip, one opening larger than the other,
    (e) the frame having a side wall which supports the periphery of the metallic strip so that a central portion of the strip may be flexed relative to said side wall.

2. The trigger of claim 1 wherein said perimeter is generally circular, and said frame is generally annular, and said central portion of the strip is inwardly of said periphery.

3. The trigger of claim 1 wherein said strip is metallic and has dished configuration in one of said configurations characterized as stable, and characterized in that the strip bulges away from said frame other wall.

4. The trigger of claim 1 wherein said strip consists of beryllium copper.

5. The combination of claim 1 that includes a flexible container containing said solution, said trigger located in the container in contact with the solution.

6. The trigger of claim 1 wherein the strip is in the form of a disc having two of said configurations between which the disc is bendable with snap displacement.

7. The trigger of claim 1 wherein said frame side wall has a groove receiving the periphery of the strip.

8. The trigger of claim 1 including a noble metal coating on the strip.

9. The trigger of claim 8 wherein said noble metal consists essentially of gold.

10. The trigger of claim 1 wherein said strip is metallic and has molecular structure which is impact oriented.

11. The trigger of claim 10 wherein said openings are distributed over the disc area, said openings having pin-hole size.

12. The trigger of claim 1 wherein said frame consists of molded elastic material confining said perimeter.

13. The trigger of claim 12 wherein said frame includes another wall extending at one side of the strip in spaced relation therewith.

14. The trigger of claim 13 wherein said strip has an outer portion surrounding said central portion, said openings located in one of said portions, the other wall defining said other smaller opening.

15. The combination of claim 14 that includes a flexible container containing said solution, the trigger located in the container so that said other smaller opening is visible through a transparent portion of the container.

* * * * *